United States Patent
Priel et al.

(10) Patent No.: US 9,542,523 B2
(45) Date of Patent: Jan. 10, 2017

(54) METHOD AND APPARATUS FOR SELECTING DATA PATH ELEMENTS FOR CLONING

(75) Inventors: Michael Priel, Netanya (IL); Asher Berkovitz, Kiryat Ono (IL); Slavaf Fleshel, Ashkelon (IL); Amir Grinshpon, Tel Aviv (IL); Dan Kuzmin, Givat Shmuel (IL); Yoav Miller, Rehovot (IL)

(73) Assignee: FREESCALE SEMICONDUCTOR, INC., Austin, TX (US)

(*) Notice: Subject to any disclaimer, the term of this patent is extended or adjusted under 35 U.S.C. 154(b) by 3 days.

(21) Appl. No.: 14/424,220

(22) PCT Filed: Sep. 14, 2012

(86) PCT No.: PCT/IB2012/054802
§ 371 (c)(1),
(2), (4) Date: Feb. 26, 2015

(87) PCT Pub. No.: WO2014/041402
PCT Pub. Date: Mar. 20, 2014

(65) Prior Publication Data
US 2015/0199468 A1    Jul. 16, 2015

(51) Int. Cl.
*G06F 17/50* (2006.01)
(52) U.S. Cl.
CPC ....... *G06F 17/5081* (2013.01); *G06F 17/5031* (2013.01)

(58) Field of Classification Search
CPC .................. G06F 17/5081; G06F 17/5031
USPC .............. 716/113, 108, 134, 136; 703/16
See application file for complete search history.

(56) References Cited

U.S. PATENT DOCUMENTS

| | | | |
|---|---|---|---|
| 5,396,435 A | 3/1995 | Ginetti | |
| 5,648,909 A * | 7/1997 | Biro | G06F 17/5031 716/102 |
| 6,591,407 B1 * | 7/2003 | Kaufman | G06F 17/5068 716/114 |
| 6,678,644 B1 * | 1/2004 | Segal | G06F 17/5031 703/15 |
| 7,254,801 B1 * | 8/2007 | Borer | G06F 17/5054 716/117 |
| 7,290,240 B1 * | 10/2007 | Lam-Leventis | G06F 17/5068 716/104 |
| 7,685,405 B1 * | 3/2010 | Chow | G06F 15/7842 712/34 |
| 7,865,855 B2 | 1/2011 | Koehl et al. | |

(Continued)

OTHER PUBLICATIONS

International Search Report and Written Opinion correlating to PCT/IB2012/054802 dated Jan. 14, 2013.

*Primary Examiner* — Phallaka Kik

(57) ABSTRACT

A method and apparatus for selecting data path elements for cloning within an integrated circuit (IC) design is described. The method comprises performing timing analysis of at least one data path within the IC design to determine at least one timing slack value for the at least one data path, calculating at least one annotated delay value for cloning a candidate element within the at least one data path, calculating at least one modified slack value for the at least one data path in accordance with the at least one calculated annotated delay value, and validating the cloning of the candidate element based at least partly on the at least one modified slack value.

13 Claims, 5 Drawing Sheets

(56) References Cited

U.S. PATENT DOCUMENTS

| | | | | |
|---|---|---|---|---|
| 7,913,022 | B1* | 3/2011 | Baxter | G06F 13/1605 |
| | | | | 326/38 |
| 9,135,375 | B1* | 9/2015 | Sood | G06F 17/50 |
| 2006/0129961 | A1* | 6/2006 | Paul | G06F 17/5045 |
| | | | | 716/103 |
| 2007/0288716 | A1* | 12/2007 | Prete | G06F 13/1689 |
| | | | | 711/167 |
| 2008/0276209 | A1* | 11/2008 | Albrecht | G06F 17/5031 |
| | | | | 716/113 |
| 2009/0125859 | A1 | 5/2009 | Alpert et al. | |
| 2010/0070941 | A1 | 3/2010 | Sircar et al. | |
| 2010/0287400 | A1* | 11/2010 | Chou | G06F 9/3871 |
| | | | | 713/400 |
| 2012/0079437 | A1 | 3/2012 | Li et al. | |
| 2012/0124539 | A1 | 5/2012 | Alpert et al. | |
| 2012/0227022 | A1* | 9/2012 | De | G06F 17/5031 |
| | | | | 716/107 |

\* cited by examiner

METHOD AND APPARATUS FOR SELECTING DATA PATH ELEMENTS FOR CLONING

FIELD OF THE INVENTION

The field of this invention relates to a method for selecting data path elements for cloning, and in particular to a method for selecting data path elements for cloning within an integrated circuit (IC) design, and apparatus therefor.

BACKGROUND OF THE INVENTION

In the field of integrated circuit (IC) design, cloning is an optimization technique that takes an original 'launch' stage, for example comprising a flip-flop, for a critical timing path and duplicates it for use with a timing critical portion of the circuit. The original launch stage remains the start point for non-critical timing paths, whilst the 'clone' launch stage becomes the start point for the critical timing path. In this manner, timing critical paths may be separated from the non-timing critical paths, resulting in reduced fan-out and output load for the timing critical path launch stage in the cloned arrangement as compared with the original arrangement. The logic for the critical timing path may then be 'optimised', whilst the original sampling latch and the non-critical timing path remain unaffected.

The cloning of stages in this manner can provide significant improvements to the achievable operating frequency of an IC design; cloning even 1% of all launch stages within an IC design can result in frequency improvements of up to 20%. However, large scale cloning can also result in a significant increase in area of the IC design. As such, it is desirable to only clone stages within those timing critical paths that would most benefit from being cloned, and to avoid unnecessary cloning of stages that would provide little (if any) timing improvements.

Due to the enormous numbers of timing paths within modern IC designs, identifying those stages that would most benefit from being cloned is a very complicated and time consuming process. As such, manually identifying stages to be cloned is not a practical solution to optimise the cloning of such stages. Another problem with implementing cloning manually is that it requires changes to be made at the register transfer level (RTL). However, this is not always possible where parts of the IC design involve $3^{rd}$ party design blocks, and such changes in the RTL of such $3^{rd}$ party design blocks may require architectural licences, etc., which are often extremely expensive to obtain. Thus, the necessary RTL changes that would be required to implement cloning manually within such 3rd party design blocks are often not possible.

A problem with typical current automated techniques for implementing the cloning of stages is that typically they involve cloning the launch stages for all critical paths, together with all of the combinational logic within the critical paths for those stages. As such, there is no assessment of how beneficial such cloning is for individual critical paths, typically resulting in a significant amount of unnecessary cloning, and thus unnecessary increase in area.

U.S. Pat. No. 536,435 discloses an automated method of identifying candidate gates for cloning within timing critical paths, and individually implementing such cloning for each candidate gate by way of updating a respective netlist to include the cloning of the candidate gate, re-tiling and re-buffering the modified netlist circuit, and then recalculating slack values to assess whether the cloning of the candidate has improved the timing values. If timing values are not improved, the netlist is reverted back to before that particular cloning was implemented. This process is performed for each candidate gate within each timing critical path. Advantageously, unnecessary cloning of gates which would provide little if any improvement may be avoided. However, the large number of potential timing critical paths, and thus the large number of potentially cloned stages, within an IC design (e.g. ~500,000 potentially cloned stages) means that the amount of time such synthesis would require to assess all possible candidate gates within all timing critical paths is not practically feasible.

SUMMARY OF THE INVENTION

The present invention provides a method for selecting data path elements for cloning within an integrated circuit (IC) design, a non-transitory computer program product having executable program code stored therein for programming signal processing logic to perform a method of selecting data path elements for cloning within an integrated circuit (IC) design, and an apparatus for implementing selecting data path elements for cloning within an integrated circuit (IC) design, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

The present invention will now be described with reference to one example of a method and apparatus for selecting data path elements for cloning within an integrated circuit (IC) design. However, it will be appreciated that the present invention is not limited to the specific implementations herein described. Furthermore, because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
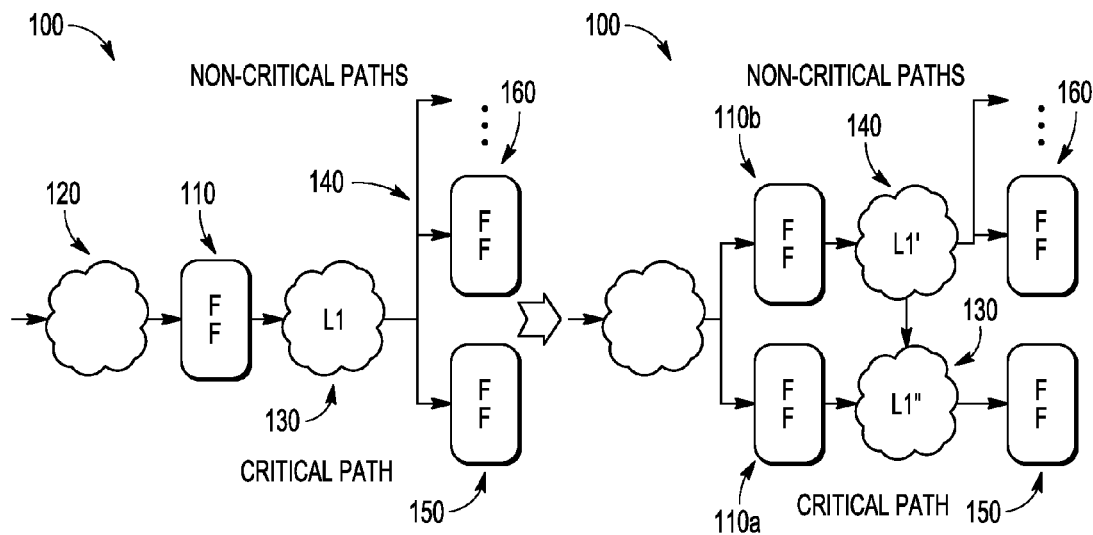
FIG. 1 illustrates a simplified block diagram showing the cloning of a data path element within an integrated circuit design.

Referring first to FIG. 1, there is illustrated a simplified block diagram showing the cloning of a data path element within an integrated circuit design. On the left hand side of FIG. 1 there is illustrated a simplified block diagram of a part of an integrated circuit design 100 comprising a first data path element 110, which in the illustrated example comprises a flip-flop arranged to comprise a 'capture' element for a first data path 120 of the integrated circuit design 100. In addition, the data path element 110 further comprises a 'launch' element for one or more further data paths. In particular in the illustrated example, the data path element 110 comprises a launch element for a first, timing critical data path 130, and one or more timing non-critical data paths 140. Each of these data paths 130, 140 for which the first data path element 110 comprises a launch element, and thus which may be considered to originate at the first data path element 110, terminate at respective capture data path elements 150, 160.

In order to improve the timings for timing critical data paths, it is known to implement cloning of launch elements for such timing critical data paths. An example of such a cloning for the launch element 110 within the integrated circuit design 100 of FIG. 1 is illustrated on the right hand side thereof. As can be seen, the launch element 110 is 'cloned', resulting in two separate data path elements 110a and 110b being implemented in place of the single original data element 110. In this manner, one of the clone data path elements 110a may be substantially dedicated to driving the timing critical data path 130, thereby reducing the load required to be driven by that cloned launch element 110a (compared to the original single launch element 110), and potentially enabling a smaller launch element to be implemented for the timing critical data path 130. As a result, the signal propagation time for the timing critical data path may be improved.

Referring now to FIGS. 2 to 5, there are illustrated simplified flowcharts 200, 300, 400, 500 of an example of a method of selecting data path elements for cloning within an integrated circuit (IC) design. In summary, the method comprises performing timing analysis of at least one data path within an IC design to determine at least one timing slack value for the at least one data path, calculating at least one annotated delay value for cloning a candidate element within the at least one data path, calculating at least one modified slack value for the at least one data path in accordance with the at least one calculated annotated delay value, and validating the cloning of the candidate element based at least partly on the at least one modified slack value.

The use of such annotated delay values to modify slack values to represent the cloning of candidate elements within timing critical paths in this manner, without the need to actually implement such cloning (e.g. by way of updating a respective netlist to include the cloning of the candidate element, re-tiling and re-buffering the modified netlist circuit, etc.), significantly reduces the amount of time and effort required to validate the cloning of the candidate elements.

Figure 2:
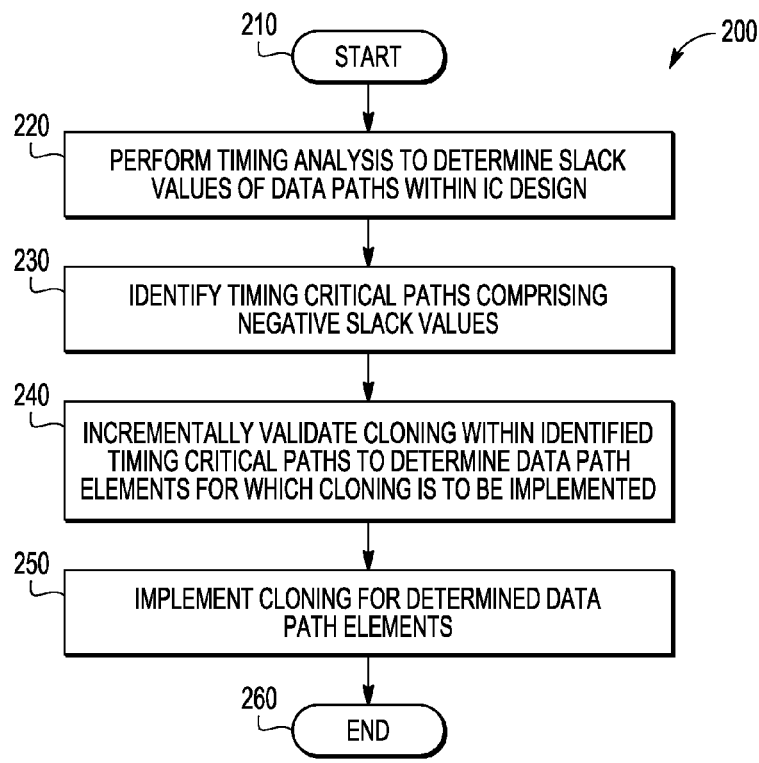
FIGS. 2 to 5 illustrate simplified flowcharts of an example of a method of selecting data path elements for cloning within an integrated circuit (IC) design.

Referring first to FIG. 2, the method starts at 210 and moves on to 220 where timing analysis is performed to determine timing slack values for data paths within the IC design. For example, a user may define a setup timing constraint comprising an amount of time within which a data signal is required to propagate through a data path in order to avoid a timing setup violation. Thus, a positive slack value represents an amount of time by which a timing violation is avoided; a slack value of '0' means that the timing constraint is only just met; and a negative slack value represents an amount of time by which the timing constraint is violated. Techniques for performing such timing analysis are generally well known in the art, and as such shall not be described in any further detail.

Next, at 230, one or more timing critical paths comprising negative slack values are identified. The cloning of data path elements within the identified timing critical paths is then validated to determine data path elements for which cloning is to be implemented, at 240, as described in greater detail below with reference to FIG. 3. Cloning may then be implemented for the determined data path elements (e.g. by appropriate updating of gate-level netlists, etc. for the IC design), at 250, and the method then ends at 260.

Significantly, by validating the cloning of data path elements within the identified timing critical paths in this manner, data path elements for which cloning would be beneficial may be identified, thereby enabling cloning to be implemented only for those identified data path elements for which such cloning would be beneficial, thus enabling the benefits of cloning to be achieved whilst reducing the area increase involved as compared with the conventional 'all or nothing' approach of prior art techniques. Furthermore, the process of actually implementing such cloning (e.g. comprising updating a respective netlist to include the cloning of candidate gates, re-tiling and re-buffering the modified netlist circuit, etc.) comprises significant time/resource consumption. Accordingly, by enabling candidate gates to be validated ahead of any implementation thereof being necessary, the likelihood of such implementation having to be repeated (e.g. due to a cloning implementation subsequently being found to be unnecessary/ineffective) is significantly reduced. Thus, by performing such validation prior to implementing such cloning, time and effort may be saved in the development of the IC design by minimising wasted effort in implementing unnecessary, and subsequently undone, cloning of data path elements.

In some examples, the method of FIG. 2 may be repeated, in conjunction with other optimization techniques, for example until all timing critical issues have been overcome, or until no further suitable data path elements for cloning are identified.

Figure 3:
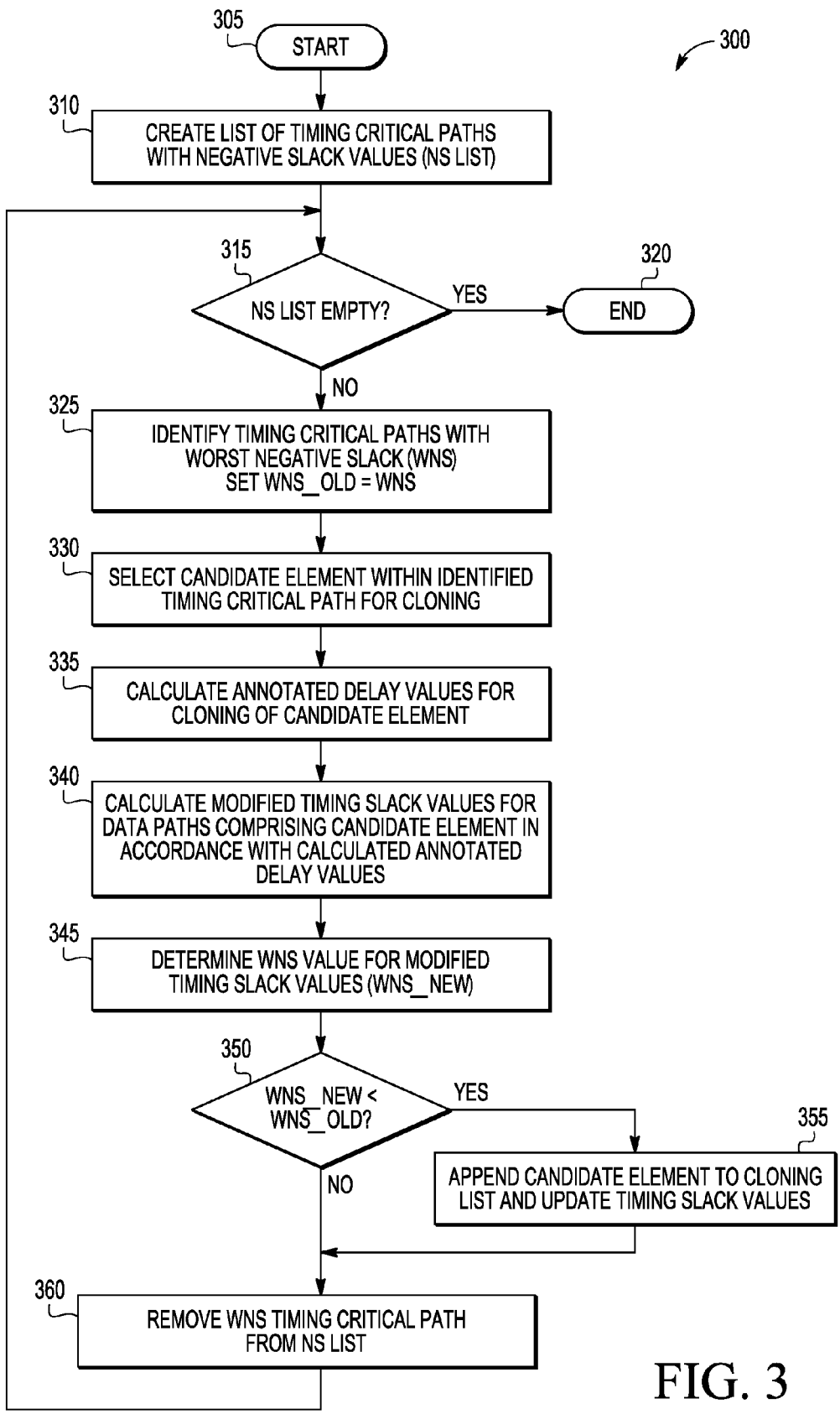

Referring now to FIG. 3, there is illustrated a simplified flowchart 300 illustrating an example of a part of the method for validating the cloning of data path elements within the identified timing critical paths, such as may be performed at 240 in the flowchart of FIG. 2. This part of the method starts at 305, and moves on to 310 where in the illustrated example a list of timing critical paths comprising negative slack values (NS list) is created, for example comprising those timing critical paths identified at 230 in FIG. 2. Following 310, if the NS list is empty (e.g. due to no data paths comprising negative slack values being identified), this part of the method ends at 320. Conversely, if the NS list comprises at least one timing critical path comprising a negative slack value, the method moves on to 325, where a timing critical path comprising a worst negative slack (WNS) value, e.g. the largest magnitude negative slack value, and a WNS_old' variable is set equal to the WNS value. Next, at 330, a candidate data path element for cloning is selected from the timing critical path comprising the worst negative slack value. Such a candidate data path element may comprise a launch element, such as a launch flip-flop, of the timing critical path. Alternatively, it is contemplated in some examples that the candidate data path element may comprise a mid-path logic element, for example such as a combinational gate logic element.

One or more annotated delay value(s) is/are then calculated for cloning the candidate data path element, at 335. For example, such an annotated delay value may comprise one or more of:

- an annotated delay value for a driving data path of the candidate element representative of an additional cell load of a clone element to be driven;
- an annotated delay value for a driving data path of the candidate element representative of an additional wire load of a clone element to be driven;
- a negative annotated delay value for at least one timing critical data path driven by the candidate element representative of a reduced load for a first candidate clone element when driving the at least one timing critical data path;
- a negative annotated delay value for at least one timing critical data path driven by the candidate element representative of a reduced element size for the first candidate clone element when driving the at least one timing critical data path;
- a negative annotated delay value for at least one timing non-critical data path driven by the candidate element representative of a reduced load for a second candidate clone element when driving the at least one timing non-critical data path; and
- a negative annotated delay value for at least one timing non-critical data path driven by the candidate element representative of a reduced element size for the second candidate clone element when driving the at least one timing non-critical data path.

Modified slack values for data paths comprising the candidate element are then calculated in accordance with the calculated annotated delay values therefor, at 340. In this manner, modified slack values representative of such data paths with the candidate element cloned may be estimated and used to validate the cloning of the candidate element based at least partly on the modified slack values for all of the data paths comprising the candidate stage.

In the illustrated example, the cloning of the candidate element is validated by determining a worst negative slack value for the modified slack values (WNS_new), at 345 and comparing the worst negative slack value for the modified slack values to the worst negative slack value for unmodified slack values (WNS_old), at 350. If the new worst negative slack value the for modified slack values (WNS_new) is less than the worst negative slack value for unmodified slack values (WNS_old), then cloning of the candidate element may be deemed to be of some benefit, and therefore validated. Accordingly, the candidate element may be appended to a cloning list identifying data path elements for which cloning has been validated, at 355, and the timing slack values for data paths comprising the candidate element may also be updated to take into account the intended cloning of the candidate element for the subsequent validation of further data path elements. The method may then move on to 360, where the timing critical data path comprising the candidate element may be removed from the NS list, and the method loops back to 315 to repeat the process for further timing critical data paths comprising negative slack values.

Reverting back to 350, if the new worst negative slack value the for modified slack values (WNS_new) is not less than the worst negative slack value for unmodified slack values (WNS_old), then cloning of the candidate element may be deemed not to be of any benefit, and therefore not validated. Accordingly, the method may move straight to 360, without appending the candidate element to the cloning list.

In this manner, candidate elements within each identified timing critical path comprising a negative slack value may be incrementally validated. In particular in the illustrated example, candidate elements within each identified timing critical path comprising a negative slack value may be incrementally validated starting with a timing critical path comprising a worst negative slack value and sequentially progressing through the identified timing critical paths from the timing critical path comprising a worst negative slack value through to the timing critical path comprising a least negative slack value, until the negative slack list (NL list) is empty.

Figure 4:
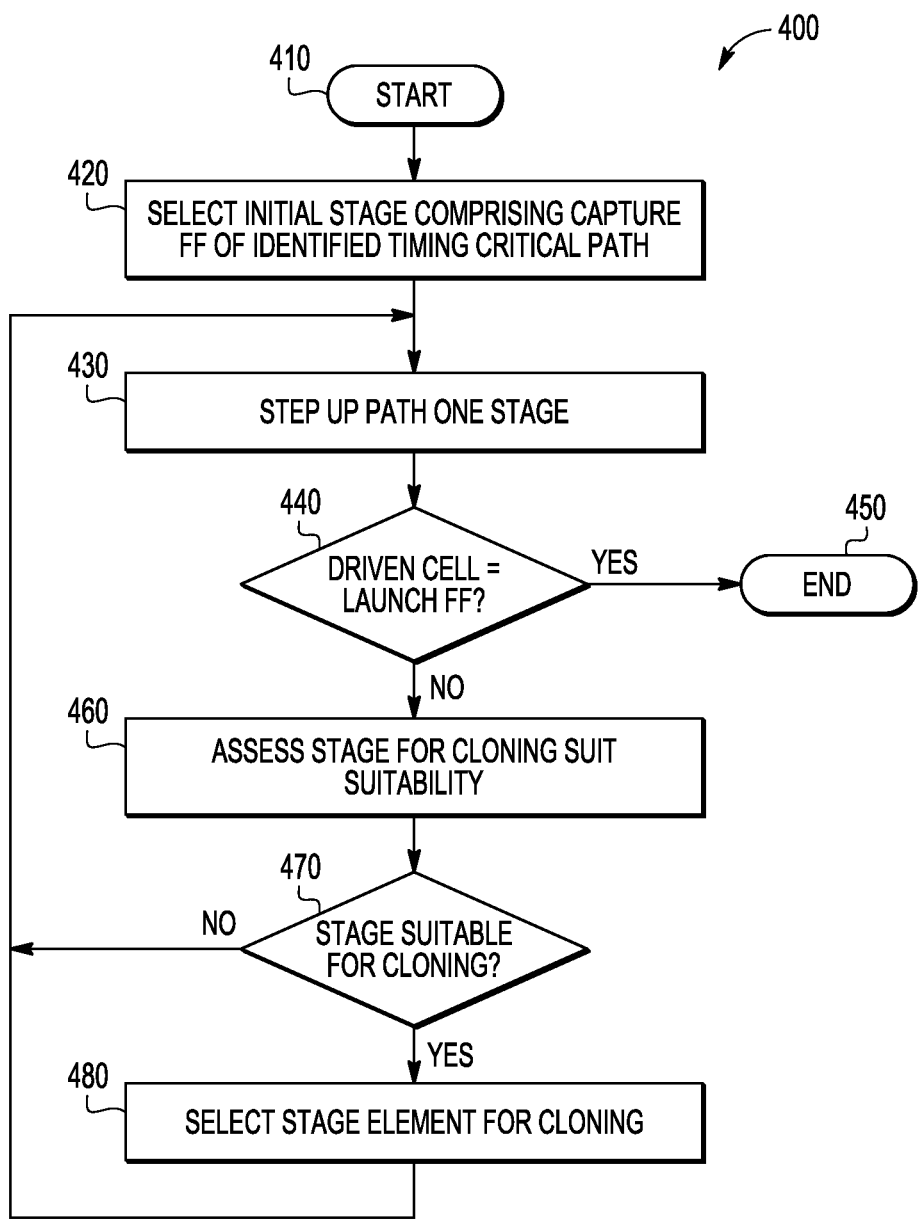

Referring now to FIG. 4, there is illustrated an example of a simplified flowchart 400 illustrating an example of a part of the method for selecting one or more candidate elements within an identified timing critical path for cloning, such as may be implemented at 330 within the flowchart of FIG. 3. The flowchart of FIG. 4 starts at 410, and moves on to 420 where an initial stage is selected comprising a capture flip-flop of the timing critical path. Next, at 430, the flowchart steps 'up' the timing critical path from the current stage to the previous stage within the timing critical path, i.e. in a direction towards a launch flip-flop of the timing critical path. The flowchart then moves on to 440 where it is determined whether the launch flip-flop of the timing critical path comprises a driven cell of the current stage. Whilst the launch flip-flop is not a driven cell of the current stage, the flowchart moves on to 460, where the suitability of the current stage for an element thereof to be cloned is assessed (as described in greater detail below with reference to FIG. 5). If it is determined that the current stage is not suitable for an element thereof to be cloned, at 470, the flowchart loops back to 430, where the flowchart steps up the timing critical path to the next (previous) stage of the timing critical path. Conversely, if it is determined that the current stage is suitable for an element thereof to be cloned, the flowchart moves on to 480, where an element of the current stage is selected for cloning. For example, the current stage may comprise one or more combinational logic gates, one (or more) of which may be selected as the element for cloning. The flowchart then loops back to 430, where the flowchart steps up the timing critical path to the next (previous) stage of the timing critical path. The flowchart is repeated for each stage in the timing critical path, up to and including the launch flip-flop stage, at which point the flowchart ends at 450.

In this manner, the stages of the timing critical path may be sequentially assessed for their suitability in relation to cloning, and thus respective candidate elements from the suitable stages may be sequentially selected for cloning. In particular in the illustrated example, the sequence in which the stages of the timing critical path may be assessed starts at the capture end of the timing critical path and steps back up the timing critical path towards the launch end thereof. Significantly, in the illustrated example, elements selected for cloning are not limited to launch elements (e.g. launch flip-flops), but may include elements from stages between the launch and capture elements, for example such as combinational logic gates etc.

In some examples, when cloning an element, it is necessary to also duplicate all logic, etc. between the cloned element and the capture element of that path. As such, for cloning techniques that rely on cloning of the launch flip-flop for a timing critical path (i.e. such as the known techniques), it is also necessary to duplicate all subsequent stages within that critical path up to the capture flip-flop. By contrast, by enabling cloning to be performed 'mid-path' as described herein, only those stages located between the cloned stage and the capture flip-flop need be duplicated, thereby enabling a more efficient cloning technique. Furthermore, by sequentially selecting candidate elements from suitable stages starting at a capture end of the timing critical path and stepping back up towards the launch end of the timing critical path, and sequentially (and incrementally) validating the cloning of each candidate element as described above, data path elements may be selected for cloning in a much more efficient manner by reducing the amount of logic that needs to be duplicated downstream of the cloned elements.

Figure 5:
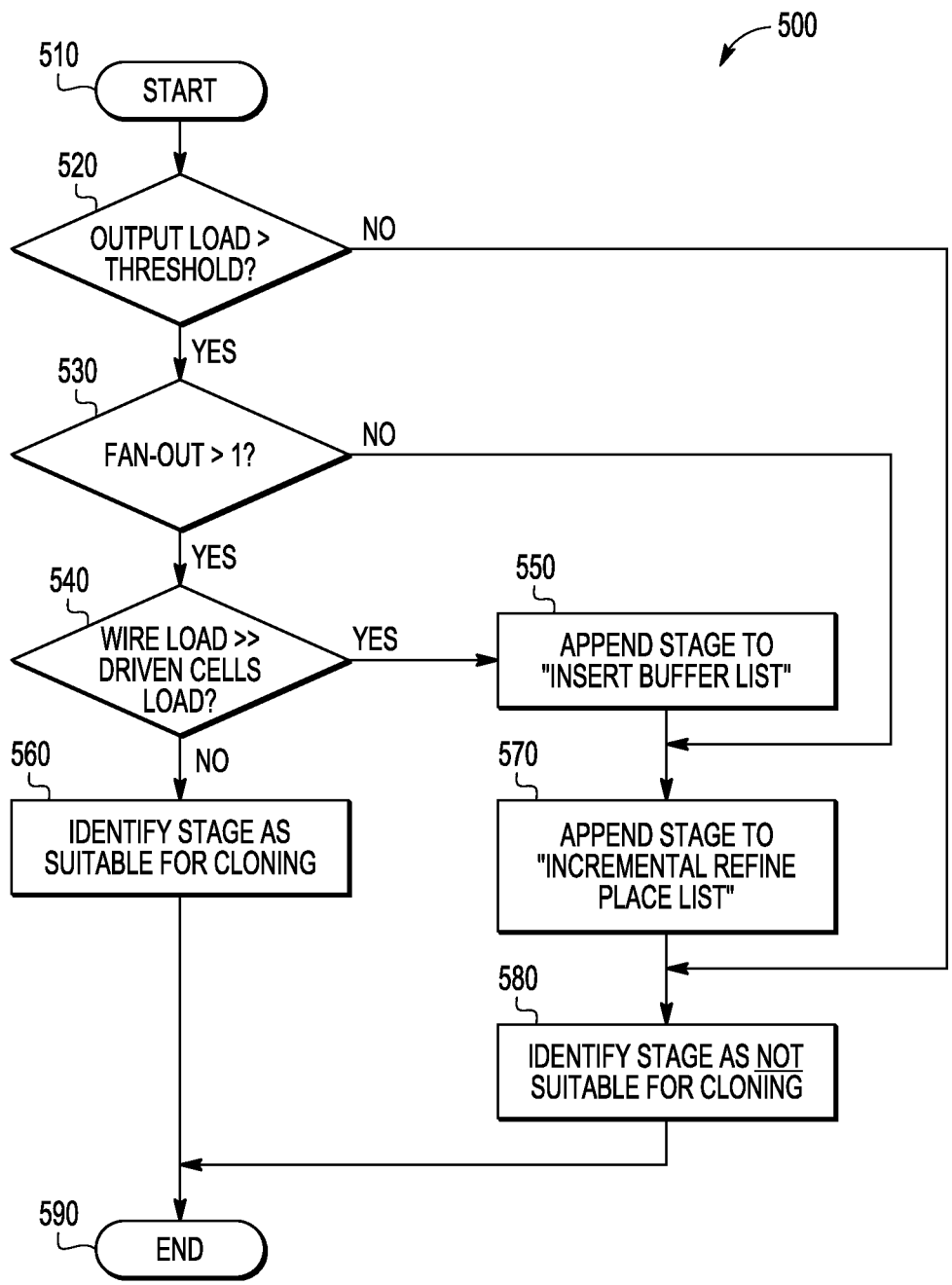

Referring now to FIG. 5, there is illustrated an example of a simplified flowchart 500 illustrating an example of a part of a method for assessing a suitability of a stage (or element thereof) to be cloned, such as may be implemented at 460 within the flowchart of FIG. 4. The method starts at 510, and moves on to where it is determined whether an output load of the current stage is, say, greater than an output load threshold. In this example, if the output load of the current stage is not greater than the output load threshold, where the output load threshold is set to represent, say, a minimum load value for which cloning is beneficial, then cloning of an element of the current stage is unlikely to improve the timing performance of the timing critical path. As such, that stage may be determined as not being suitable for cloning, at 580, and the flowchart ends at 590.

However, in this example, if the output load of the current stage is greater than the output load threshold, the flowchart moves on to 530, where it is determined whether the output of the current stage comprises a fan-out greater than one. If the output of the current stage does not comprise a fan-out greater than one, e.g. the current stage only drives one downstream stage, then there is not practical benefit to cloning that stage, and thus cloning would not be suitable. However, in the illustrated example, if the output of the current stage of the timing critical path only comprises a fan-out of one, the current stage is identified as a candidate for distance reduction between itself and the stage driven thereby, and appended to an "Incremental Refine Place List" at 570. The current stage is then determined as not being suitable for cloning, at 580, and the flowchart ends at 590.

However, if the output of the current stage comprises a fan-out greater than one, the flowchart moves on to 540, where it is determined whether a wire load of the current stage is significantly greater than the combined load of the driven cells. For example, the wire load may be determined to be significantly greater than the combined load of the driven cells if it exceeds the combined load of the driven cells by more than a delta threshold value. If the wire load is significantly greater than the combined load of the driven cells, inserting a minimum size buffer into the timing critical path at the output of the current stage may be sufficient to overcome the effect of the high wire load for the current stage on the timing critical path, without the need for the current stage to be cloned. Accordingly, in the illustrated example, if the wire load is determined to be significantly greater than the combined load of the driven cells, the flowchart moves on to 550, where the current stage is identified as a candidate for such a buffer to be inserted, and appended to an "Insert Buffer List". In the illustrated example, the flowchart then moves on to 570, where the current stage is also identified as a candidate for distance reduction between itself and the stage driven thereby, and appended to an "Incremental Refine Place List". The current stage is then determined as not being suitable for cloning, at 580, and the method ends at 590.

However, if the wire load is determined not to be significantly greater than the combined load of the driven cells, the flowchart moves on to 560, where the current stage is identified as being suitable for cloning, and the method ends at 590.

Figure 6:
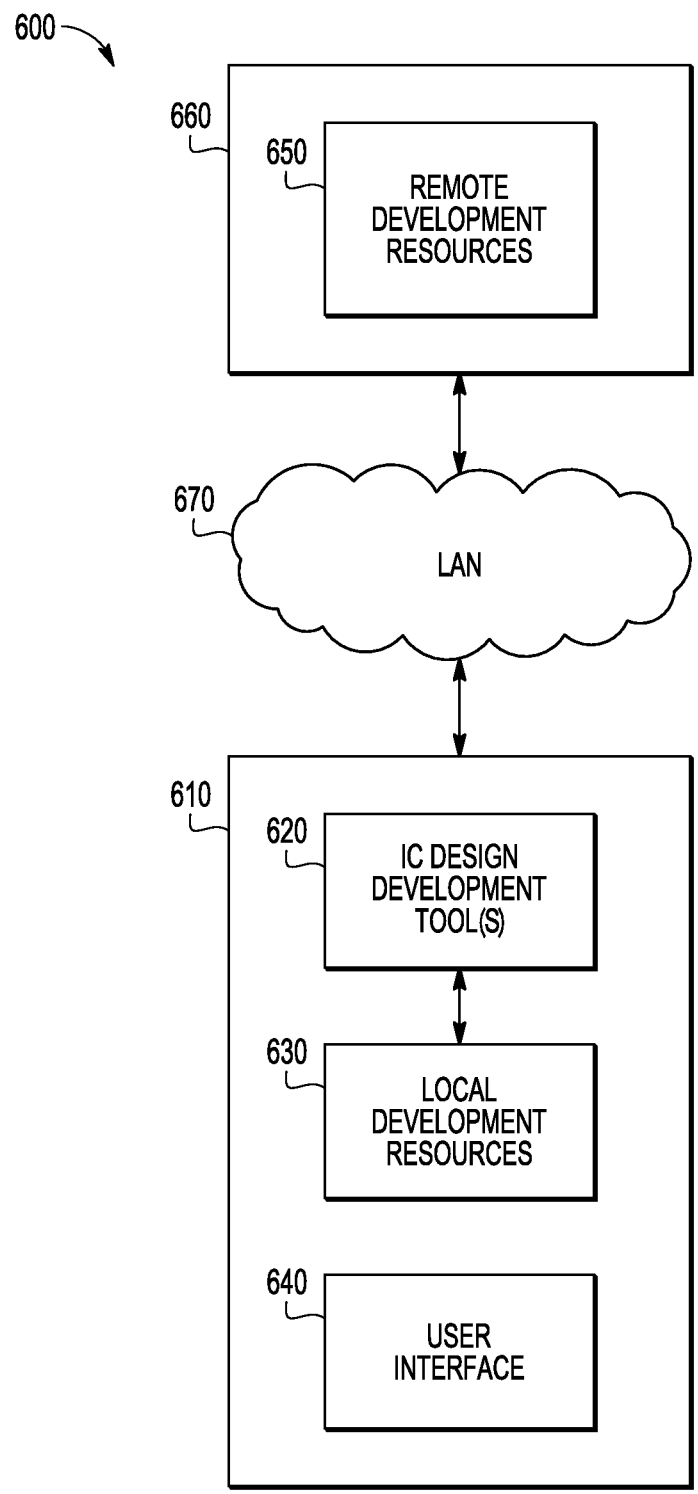
FIG. 6 illustrates a simplified block diagram of an example of an apparatus adapted to perform a method of selecting data path elements for cloning within an integrated circuit (IC) design.

Referring now to FIG. 6, there is illustrated a simplified block diagram of an example of an apparatus 600 adapted in accordance with some examples of the present invention. In the illustrated example, the apparatus 600 comprises a computer system 610 arranged to execute one or more IC design development tools 620 arranged to perform, either jointly or individually, the method hereinbefore described with reference to FIGS. 2 and 3. For example, the computer system 610 may comprise one or more central processing units (CPUs) (not shown) on which such IC design development tools 620 may run.

The computer system 610 may further comprises one or more local development resources 630 to which the IC design development tools 620 running thereon have access to, for example, stored within one or more areas of local memory such as stored within one or more local hard drives and/or optical drivers, and/or stored within one or more areas of local Flash memory and/or RAM (Random Access Memory). Such development resources may comprise, by way of example, RTL files, gate-level netlists, timing analysis data, etc.

The computer system 610 further comprises a user interface 640, for example comprising one or more input devices such as a keyboard, pointer device, etc. and one or more output devices such as a computer screen, etc. In this manner, a user is able to interact with the IC design development tools 620 running thereon.

The computer system 610 may have access to remote development resources 650, for example stored within a remote server 660 accessible via, say, a local area network (LAN) 670 or the like. Such remote development resources 650 may be downloaded from the remote server 660 to the computer system 610 as required, thereby adding to and/or replacing some or all of the local development resources 630. In this manner, public development resources may be accessed by the computer system 610. Furthermore, local development resources 630 may be uploaded to the remote server 660. In this manner, local development resources may be made available to other computer systems 610 via the remote server 660.

The IC design development tools 620 may comprise computer program code executable on one or more central processing units, or other processing devices. As such, it is contemplated that the IC design development tools 620 may be implemented by way of executable program code stored within a non-transitory computer program. As used herein, the expression non-transitory will be understood to refer to the non-ephemeral nature of the storage medium itself rather than to a notion of how long the stored information itself may persist in a stored state. Accordingly, memories that might otherwise be viewed, for example, as being volatile (such as many electronically-erasable programmable read-only memories (EEPROMs) or random-access memories (RAMs)) are nevertheless to be viewed here as being 'non-transitory' whereas a signal carrier in transit is to be considered 'transitory' notwithstanding that the signal may remain in transit for a lengthy period of time.)

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; non-volatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A method of selecting data path elements for cloning within an integrated circuit (IC) design, the method comprising:
    performing timing analysis of at least one data path within the IC design to determine at least one timing slack value for the at least one data path;
    calculating at least one annotated delay value for cloning a candidate element within the at least one data path;
    calculating at least one modified slack value for the at least one data path in accordance with the at least one calculated annotated delay value;
    validating the cloning of the candidate element based at least partly on the at least one modified slack value; and
    fabricating the IC design based at least on the validated cloning of the candidate element.

2. The method of claim 1, wherein the method further comprises:
    identifying at least one timing critical path comprising a negative slack value; and
    selecting the candidate element for cloning from the at least one timing critical path comprising a negative slack value.

3. The method of claim 2, wherein the method comprises:
    identifying a timing critical path comprising a worst negative slack value; and
    selecting the candidate element for cloning from the at least one timing critical path comprising the worst negative slack value.

4. The method of claim 1, wherein calculating the at least one annotated delay value for cloning the candidate element comprises calculating at least one from a group comprising:
    an annotated delay value for a driving data path of the candidate element representative of an additional load of a clone element to be driven;
    a negative annotated delay value for at least one timing critical data path driven by the candidate element representative of a reduced load for a first candidate clone element when driving the at least one timing critical data path;
    a negative annotated delay value for at least one timing critical data path driven by the candidate element representative of a reduced element size for the first candidate clone element when driving the at least one timing critical data path;
    a negative annotated delay value for at least one timing non-critical data path driven by the candidate element representative of a reduced load for a second candidate clone element when driving the at least one timing non-critical data path; and
    a negative annotated delay value for at least one timing non-critical data path driven by the candidate element representative of a reduced element size for the second candidate clone element when driving the at least one timing non-critical data path.

5. The method of claim 1, wherein the method comprises:
calculating at least one modified slack value for each data path comprising a candidate stage; and
validating the cloning of the candidate element based at least partly on the modified slack values for all of the data paths comprising the candidate stage.

6. The method of claim 1, where the method comprises:
identifying a timing critical path comprising a worst negative slack value;
selecting a candidate element for cloning from the at least one timing critical path comprising a worst negative slack value;
calculating at least one modified slack value for each data path comprising the candidate stage in accordance with the at least one calculated annotated delay value;
determining a new worst negative slack value; and
validating the cloning of the candidate element if the new worst negative slack value for modified slack values is less than the worst negative slack value for unmodified slack values.

7. The method of claim 1, wherein the method comprises;
identifying timing critical paths comprising negative slack values; and
incrementally validating at least one candidate element within each identified timing critical path comprising a negative slack value.

8. The method of claim 7, wherein the method comprises:
incrementally validating at least one candidate element within each identified timing critical path comprising a negative slack value starting with a timing critical path comprising a worst negative slack value and sequentially progressing through the identified timing critical paths from the timing critical path comprising a worst negative slack value through to the timing critical path comprising a least negative slack value.

9. The method of claim 1, wherein the method further comprises assessing a suitability of each stage of the at least one data path for cloning.

10. The method of claim 9, wherein the method comprises sequentially selecting candidate elements from stages identified as being suitable for cloning, starting at a capture end of the at least one data path and stepping back up towards a launch end of the at least one data path.

11. The method of claim 9, wherein assessing the suitability of a stage of the at least one data path for cloning comprises determining whether the stage fulfils at least one criteria from a group comprising:
an output load of the stage being greater than an output load threshold value;
an output of the stage comprising a fan-out greater than one; and
an output wire load of the stage exceeding a combined load of driven cells by more than a delta threshold value.

12. The method of claim 11, wherein the method comprises identifying a stage of the at least one data path as a candidate stage for buffer insertion if an output wire load of said stage exceeds a combined load of driven cells by more than a delta threshold value.

13. The method of claim 11, wherein the method comprises identifying a stage of the at least one data path as a candidate stage for distance reduction between itself and at least one stage driven thereby if at least one criterion is met from a group comprising:
an output of said stage comprises a fan-out of one; and
an output wire load of said stage exceed a combined load of driven cells by more than a delta threshold value.

* * * * *